United States Patent
Hashemi et al.

(10) Patent No.: US 9,850,944 B2
(45) Date of Patent: Dec. 26, 2017

(54) SLIM DRAWER SLIDE

(71) Applicant: Accuride International Inc., Santa Fe Springs, CA (US)

(72) Inventors: Darush David Hashemi, Trabuco Canyon, CA (US); Hai Le, Santa Fe Springs, CA (US); Jack Parvin, Santa Fe Springs, CA (US); Yang Wenming, Singapore (SG); Zhang Xiang, Suzhou (CN)

(73) Assignee: Accuride International Inc., Sante Fe Springs, CA (US)

( * ) Notice: Subject to any disclaimer, the term of this patent is extended or adjusted under 35 U.S.C. 154(b) by 0 days.

(21) Appl. No.: 15/265,737

(22) Filed: Sep. 14, 2016

(65) Prior Publication Data

US 2017/0000260 A1    Jan. 5, 2017

Related U.S. Application Data

(62) Division of application No. 14/867,756, filed on Sep. 28, 2015, now Pat. No. 9,739,306, which is a division
(Continued)

(51) Int. Cl.
*A47B 88/04* (2006.01)
*F16C 29/02* (2006.01)
(Continued)

(52) U.S. Cl.
CPC .............. *F16C 29/02* (2013.01); *A47B 88/49* (2017.01); *A47B 88/493* (2017.01);
(Continued)

(58) Field of Classification Search
CPC ....... A47B 88/40; A47B 88/49; A47B 88/493; A47B 2210/0059; A47B 88/04;
(Continued)

(56) References Cited

U.S. PATENT DOCUMENTS 5,421,653 A * 6/1995 Triplette ................. F16C 33/02
312/334.32
5,871,265 A    2/1999 Stewart et al.
(Continued)

FOREIGN PATENT DOCUMENTS

EP    1413225 A1    4/2004
EP    2308348 A2    4/2011
(Continued)

OTHER PUBLICATIONS

Office action on related Chinese Patent Application No. 201480027039.0 from the State Intellectual Property Office (SIPO) dated Sep. 2, 2016.
(Continued)

*Primary Examiner* — Daniel Rohrhoff
(74) *Attorney, Agent, or Firm* — Klein, O'Neill & Singh, LLP

(57) ABSTRACT

A drawer slide member including raceways formed of folded or solid material providing additional thickness while utilizing thin material may provide for increased strength of the drawer slide.

10 Claims, 16 Drawing Sheets

Related U.S. Application Data of application No. 14/209,943, filed on Mar. 13, 2014, now Pat. No. 9,155,386.

(60) Provisional application No. 61/779,125, filed on Mar. 13, 2013.

(51) Int. Cl.

| | | |
|---|---|---|
| *F16C 29/04* | (2006.01) | |
| *H05K 7/14* | (2006.01) | |
| *A47B 88/493* | (2017.01) | |
| *A47B 88/49* | (2017.01) | |

(52) U.S. Cl.
CPC .......... *F16C 29/043* (2013.01); *F16C 29/048* (2013.01); *H05K 7/1489* (2013.01); *A47B 2210/0029* (2013.01); *A47B 2210/0059* (2013.01); *F16C 2314/72* (2013.01)

(58) Field of Classification Search
CPC .............. A47B 88/0422; A47B 88/044; A47B 2088/04; A47B 2088/0403
See application file for complete search history.

(56) References Cited

U.S. PATENT DOCUMENTS

| | | | |
|---|---|---|---|
| 5,895,101 A | 4/1999 | Cabrales et al. | |
| 6,132,020 A | 10/2000 | Schael et al. | |
| 6,378,968 B1 | 4/2002 | Weng | |
| 8,251,465 B2* | 8/2012 | Yu ........................ | H05K 7/1489 |
| | | | 312/334.7 |
| 8,371,667 B2 | 2/2013 | Yu et al. | |
| 8,740,321 B2 | 6/2014 | Yu et al. | |
| 2002/0057042 A1* | 5/2002 | Milligan ................ | A47B 88/49 |
| | | | 312/334.46 |
| 2003/0071548 A1 | 4/2003 | Milligan | |
| 2004/0032192 A1 | 2/2004 | Kellenberger et al. | |
| 2004/0079712 A1 | 4/2004 | Mayer | |
| 2004/0130248 A1 | 7/2004 | Chi | |
| 2005/0029913 A1 | 2/2005 | He | |
| 2008/0129169 A1 | 6/2008 | Daino et al. | |
| 2011/0142383 A1* | 6/2011 | Yu ......................... | A47B 88/49 |
| | | | 384/35 |
| 2011/0234071 A1* | 9/2011 | Yu ......................... | A47B 88/49 |
| | | | 312/334.1 |
| 2011/0241515 A1 | 10/2011 | Park et al. | |
| 2012/0076446 A1 | 3/2012 | Chen et al. | |
| 2012/0170878 A1* | 7/2012 | Yu ........................ | A47B 88/493 |
| | | | 384/35 |
| 2013/0032678 A1 | 2/2013 | Chen et al. | |
| 2013/0039608 A1* | 2/2013 | Chen .................... | A47B 88/493 |
| | | | 384/20 |
| 2013/0108886 A1 | 5/2013 | Jahrling et al. | |
| 2014/0265790 A1* | 9/2014 | Hashemi ............... | F16C 29/048 |
| | | | 312/334.8 |

FOREIGN PATENT DOCUMENTS

| | | |
|---|---|---|
| JP | H02119834 | 9/1990 |
| JP | H11332676 A | 12/1999 |
| JP | 2012-241857 A | 12/2012 |
| TW | 200417343 A | 9/2004 |

OTHER PUBLICATIONS

Office action on related Japanese Patent Application No. 2016-502181 from the Japan Patent Office (JPO) dated Sep. 27, 2016.
International Search Report on related PCT Application No. PCT/US2014/026573 from International Searching Authority (KIPO) dated Jul. 30, 2014.
Written Opinion on related PCT Application No. PCT/US2014/026573 from International Searching Authority (KIPO) dated Jul. 30, 2014.
Extended European Search Report (EESR) on related European Patent Application No. 14775732.2 from the European Patent Office (EPO) dated Jun. 21, 2016.
U.S. Appl. No. 14/867,756, filed Sep. 28, 2015, Darush David Hashemi, Hai Le, Jack Parvin, Yang Wenming, Zhang Xiang, US 2016-0017916 A1, Office Action dated Apr. 22, 2016, Notice of Allowance dated Jun. 8, 2016; Jul. 18, 2016.
Office action on related Chinese Patent Application No. 201480027039.0 from the State Intellectual Property Office (SIPO) dated Apr. 17, 2017.
Office action on related Japanese Patent Application No. 2016-502181 from the Japan Patent Office (JPO) dated Aug. 1, 2017.

* cited by examiner

SLIM DRAWER SLIDE

CROSS-REFERENCE TO RELATED APPLICATIONS

The present application is a divisional of U.S. patent application Ser. No. 14/867,756, filed Sep. 28, 2015, which is a divisional of U.S. patent application Ser. No. 14/209,943, filed Mar. 13, 2014, which claims the benefit of the filing of U.S. Provisional Patent Application No. 61/779,125, filed on Mar. 13, 2013, the disclosures of which are incorporated by reference herein.

BACKGROUND OF THE INVENTION

The present invention relates generally to drawer slides, and more particularly to drawer slide member structures.

Drawer slides are commonly used to extendably mount casings in a structure, for example drawers in a cabinet or computer equipment in a rack. The use of drawer slides often allows for compact storage of casings, while providing relative ease of user access to the casings or items in the casings when desired.

The loads carried by drawer slides can at times be significant. The loads can exert significant forces on the drawer slides, particularly when the members of the drawer slides are extended from the structure. In addition, in some applications space allowed for drawer slides, particularly in width, may be limited, placing a premium on relative strength of drawer slide components. Unfortunately, a requirement for a thin drawer slide may prohibit the use of thicker and therefore stronger material in drawer slides, which may be undesirable in any event for cost reasons.

In rack mounted computer equipment applications, in particular, very little room may be allocated in width for a drawer slide, and the computer equipment itself may be heavy. Complicating matters, computer equipment may be in varying sizes. For example, often computer equipment is sized in a one rack unit (1U) size or a two rack unit (2U) size, and the different equipment sizes may often correlate with increased weight of equipment. The use of equipment of different rack sizes complicates drawer slide design, and, inconveniently, different drawer slides may be required for the different rack sizes.

BRIEF SUMMARY OF THE INVENTION

Aspects of the invention provide for a slim drawer slide.

In some aspects the invention provides a slide member for a drawer slide, comprising: a pair of longitudinal raceway structures separated by a longitudinal web, each of the raceway structures having an S-shaped cross section, with an outward facing portion about a first end of the S-shape being indented to form an outward facing raceway and an inward facing portion about a second end of the S-shape being indented to form an inward facing raceway.

In one aspect, the invention provides a slide member for a drawer slide, comprising: a pair of longitudinal raceway structures separated by a longitudinal web, each of the raceway structures having a cross section with: an inwardly facing arcuate raceway extending from about a longitudinal edge of the web, the inwardly facing arcuate raceway having a proximate edge about the longitudinal edge of the web and a distal edge distal from the web; a first abutment extending outward from the distal edge of the inwardly facing raceway; an outwardly facing arcuate raceway extending from the first abutment; a second abutment extending from the outwardly facing arcuate raceway and towards the proximate edge of the inwardly facing arcuate raceway; and a base extending from the second abutment, the base extending along and generally conforming to an outwardly facing surface of material forming the inwardly facing arcuate raceway.

In another aspect, the invention provides a telescopic drawer slide, comprising: an outer slide member having a longitudinal web bounded by inwardly facing arcuate raceways; an inner slide member having a longitudinal web bounded by outwardly facing arcuate raceways; and an intermediate slide member, the intermediate slide member extendably coupled to the outer slide member by bearings running in the inwardly facing arcuate raceways of the outer slide member, the intermediate slide member extendably coupled to the inner slide member by bearings running in the outwardly facing arcuate raceways of the inner slide member, the intermediate slide member having a longitudinal web bounded by inward facing arcuate raceways receiving the bearings running in the outwardly facing arcuate raceways of the inner slide member, with abutments extending outwardly from about edges of material forming the inward facing arcuate raceways, and outward facing arcuate raceways between the abutments, the outward facing arcuate raceways receiving the bearing running in the inwardly facing arcuate raceways of the outer slide member, and an extra layer of material abutting and conforming to an outer surface of the inward facing raceways. In some aspects a first of the abutments extends from an outer edge of the inward facing arcuate raceway, the outer edge being distal from the longitudinal web, and a second of the abutments extends from the extra layer of material about an inner edge of the inward facing arcuate raceway. In some aspects the intermediate slide member is integrally formed of a strip of material. In some aspects the intermediate slide member includes at least one pair of opposing angled transitions. In some aspects at least one pair of opposing angled transitions is separated by an offset platform of the longitudinal web. In some aspects at least one pair of angled transitions includes two pairs of angled transitions.

These and other aspects of the invention are more fully comprehended on review of this disclosure.

DETAILED DESCRIPTION

Figure 1A:
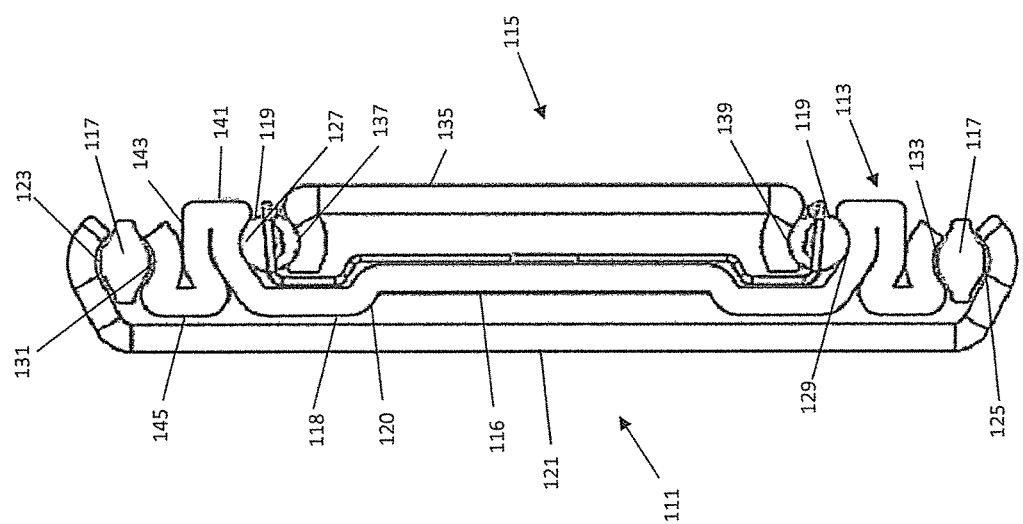
FIG. 1A is a cross-sectional view of a telescopic drawer slide in accordance with aspects of the invention.

FIG. 1A is a cross-sectional view of a telescopic drawer slide in accordance with aspects of the invention. Generally telescopic drawer slides include slide members, sometimes called rails, nestled within one another and extendable in a telescopic manner. Telescopic drawer slides may be, for example, two member drawer slides or three-member drawer slides. In a two member drawer slide an inner slide member is generally nestled within and telescopically extendable from an outer slide member. In a three-member drawer slide, an intermediate slide member is generally nestled within and telescopically extendable from the outer slide member, and the inner slide member is generally nestled within and telescopically extendable from the intermediate slide member.

The drawer slide of FIG. 1A is a three member drawer slide, and includes an outer slide member 111, an intermediate slide member 113, and an inner slide member 115. The outer slide member generally includes a longitudinal web 121 longitudinally bounded by opposing arcuate raceways 123, 125. The opposing arcuate raceways may be considered inwardly facing, as they generally face towards each other (and towards a center plane bisecting the slide members). The intermediate slide member 113 is generally between the arcuate raceways of the outer slide member. The intermediate slide also has a generally longitudinal web longitudinally bounded by arcuate raceways. In some embodiments, and as shown in FIG. 1A, the web of the intermediate slide member generally includes an inset platform 116 bounded by longitudinal strips 118, with the platform and the strips coupled by a transition 120. The strips are generally closer to the web of the outer slide member, while the platform is offset from the web of the outer slide member, for example to provide clearance for various items, which in some embodiments may include mounting hardware associated with the outer slide member or other items.

The raceways of the intermediate slide member include a first set of arcuate raceways 127, 129 facing inwardly, and a second set of arcuate raceways 131, 133 facing outwardly towards the raceways of the outer slide member. The outwardly facing raceways of the intermediate slide member are slidably or rollably coupled to the inwardly facing raceways of the outer slide member, for example by way of bearings, which may be held, as in FIG. 1A, by a bearing spacer or retainer 117. In turn, nestled within the inwardly facing raceways of the intermediate slide member is the inner slide member 115. The inner slide member, like the outer slide member, has a longitudinal web 135 longitudinally bounded by arcuate raceways 137, 139, with the raceways of the inner slide member being generally outwardly facing. The outwardly facing raceways of the inner slide member are slidably or rollably coupled to the inwardly facing raceways of the intermediate slide member, for example, by way of bearings 119.

Considering the intermediate slide member, the inward facing raceways extend from longitudinal edges of the longitudinal web. The outwardly facing raceways are outward of the inwardly facing raceways. The raceways of the intermediate slide of FIG. 1A are formed of triple thickness material. The triple thickness material may be considered, in some respects, as forming an S-shape, with an outward facing portion about one end of the S being indented to form an outwardly facing raceway, and an inward facing portion about another end of the S also being indented to form an inwardly facing raceway.

Referring for simplicity to only one set of the raceways of the intermediate slide member, the opposing sets of raceways having a symmetrical shape, as shown in the embodiment of FIG. 1A, the inwardly facing arcuate raceway 127 extends out from a longitudinal edge of the longitudinal web. The inwardly facing raceway forms a first layer of material. A first vertical spacer 141 extends outwardly from an end of the inwardly facing arcuate raceway. A second layer 143 of material of the slide member extends generally towards a plane defined by the longitudinal web. In some embodiments, and as shown in FIG. 1A, the second layer of material is in contact with and generally conforms to the shape of an outward surface of the material forming the inwardly arcuate raceway. A second vertical spacer 145 extends outwardly from the end of the second layer of material. The arcuate outwardly facing raceway 131, forming a third layer of material, extends from an outward end of the second vertical spacer and away from the plane defined by the longitudinal web.

Figure 1B:
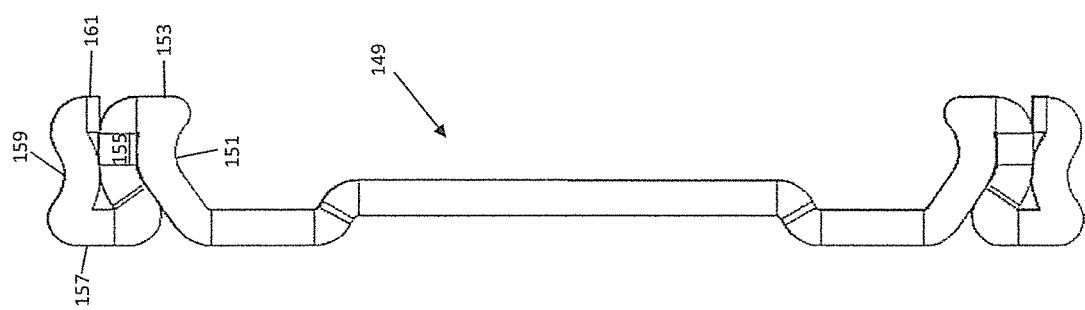
FIG. 1B illustrates a cross-section of a further drawer slide member in accordance with aspects of the invention.

FIG. 1B illustrates a further drawer slide member in accordance with aspects of the invention. The drawer slide member is similar in shape to the intermediate slide member of FIG. 1A, and may be used, for example, as an intermediate slide member in the drawer slide of FIG. 1A. The intermediate slide member of FIG. 1B is symmetrical about a longitudinal center plane, and for simplicity, and as done for FIG. 1A, only one set of raceways will be specifically discussed below.

As with the intermediate slide member of FIG. 1A, the drawer slide member of FIG. 1B includes a longitudinal web 149 and raceways formed of triple thickness material that may be considered as forming an S-shape, with a flattened top and bottom to form arcuate raceways. Accordingly, the drawer slide member of FIG. 1B includes an inwardly facing arcuate raceway 151, a first vertical spacer 153, a second layer of material 155, a second vertical spacer 157, and an outwardly facing arcuate raceway 159. The inwardly facing raceway extends from a longitudinal edge of the longitudinal web, with the first vertical spacer 153 extending outward from an end of the inwardly facing raceway. The second layer of material 155 extends back towards a plane generally defined by the web, with the second layer of material also generally conforming to the shape of the material forming the first raceway. The second vertical spacer extends outward from an end of the second layer of material, and the outwardly facing raceway extends from an outward end of the second vertical spacer.

The drawer slide member of FIG. 1B also includes a stub abutment 161 at the end edge of the outwardly facing raceway. The stub abutment extends inwardly from the end edge of the raceway, and rests, at least partially, on portions of the top of the first vertical spacer, and/or in some embodiments on the second layer of material 155. The stub abutment provides for increased support for the outwardly facing raceway.

Figure 2:
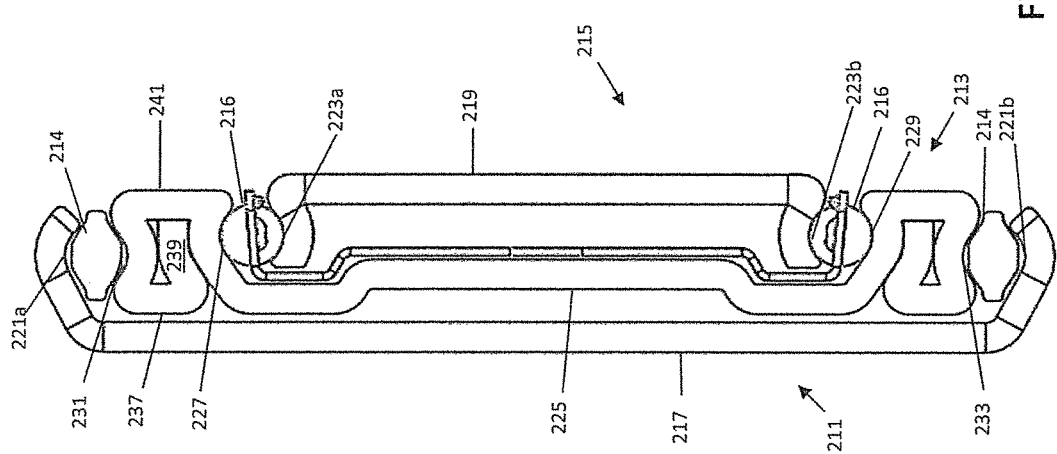
FIG. 2 illustrates a cross-section of a further drawer slide in accordance with aspects of the invention.

FIG. 2 illustrates a further drawer slide in accordance with aspects of the invention. The further drawer slide of FIG. 2 is a three-member telescopic slide, with an outer slide member 211, an intermediate slide member 213, and an inner slide member 215. A set of bearings in a bearing retainer 214 couple the outer slide member and the intermediate slide member, and a set of bearings 216 couple the intermediate slide member and the inner slide member. The outer slide member and the inner slide member are as discussed with regards to FIG. 1A, having longitudinal webs 217, 219, respectively, longitudinally bounded by arcuate raceways 221a,b, 223a,b, respectively. The arcuate raceways 221a,b of the outer slide member are inwardly facing, and the arcuate raceways 223a,b of the inner slide member are outwardly facing.

The intermediate slide member includes a longitudinal web 225, similar to the longitudinal web discussed with respect to the intermediate slide member of FIG. 1A. The intermediate slide member also includes inward facing raceways 227, 229 and outward facing raceways 231, 233.

Generally referring to only one set of raceways of the intermediate slide member, with the discussion applying to both sets of raceways, the inward facing raceway 227 extends from a longitudinal edge of the longitudinal web. As may be seen in FIG. 2, the inward facing raceway extends generally transverse to a plane defined by the longitudinal web. A first abutment 241 extends outwardly from an edge of the inward facing raceway that is distal from the longitudinal web. The outward facing raceway 231 extends substantially horizontally from a top of the first abutment. As such, the outward facing raceway also extending generally transverse to the plane defined by the longitudinal web. A second abutment 237 extends inwardly from the opposing end of the outwardly facing raceway, with the second abutment extending towards an edge of the inwardly facing raceway about the longitudinal edge of the web. A base 239 extends outwardly from the second abutment towards the first abutment, with the base generally in contact with and conforming to a shape of an outer surface of material forming the inwardly facing raceway. The base is located between the two arcuate raceways, and also provides support for the outwardly facing arcuate raceway.

In some embodiments the raceways of the intermediate slide member may be viewed as being formed of a double-hem along a longitudinal edge of the material of intermediate slide member, with opposing sides of the hem being made concavely arcuate to form the arcuate raceway. As discussed above, the double hem may be considered transverse to the longitudinal web, and may therefore be considered a transverse double hem. In some embodiments the outwardly facing raceway of the intermediate slide member may be viewed as being formed of an integrally formed pedestal extending outwardly from the inwardly facing raceway of the intermediate slide member.

Figure 3:
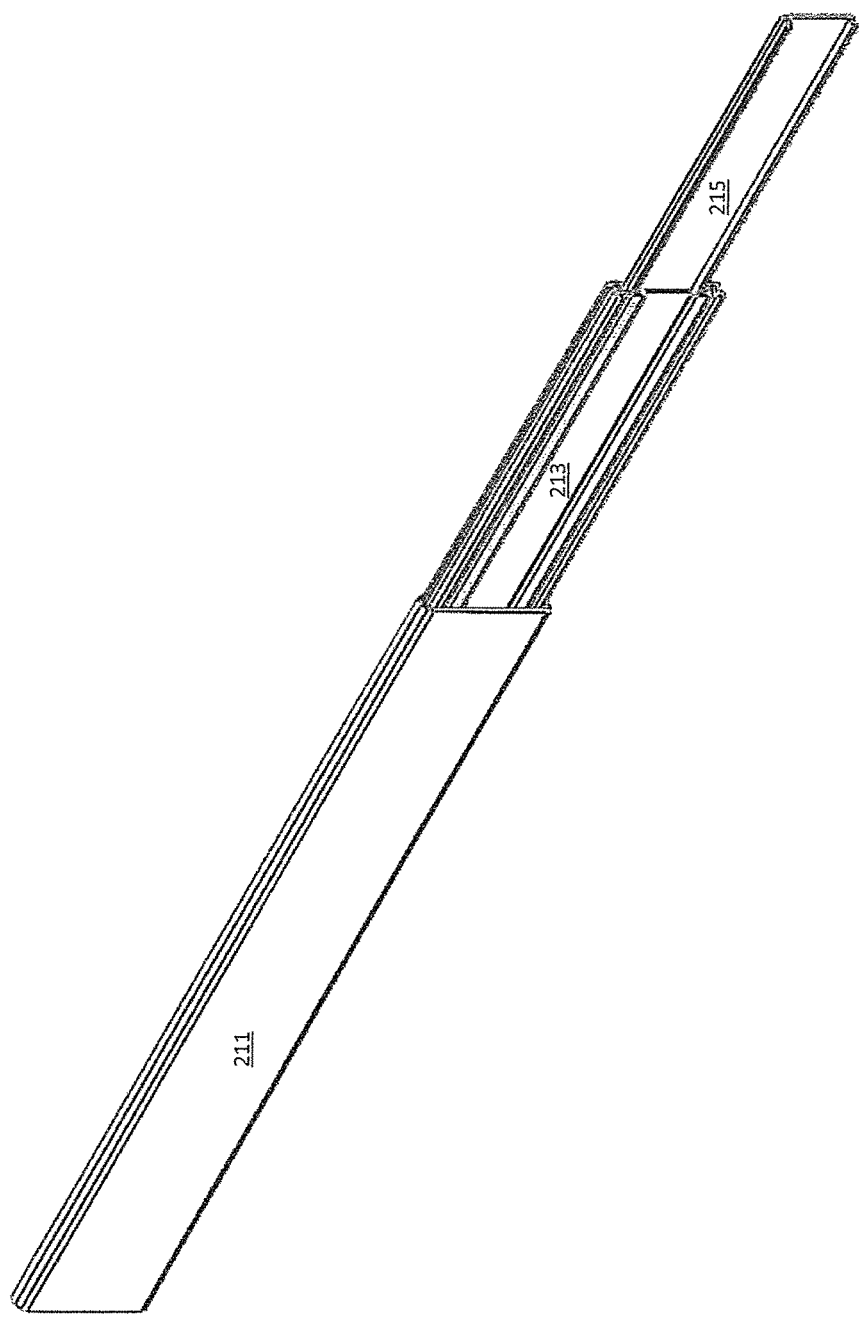
FIG. 3 illustrates the drawer slide of FIG. 1 in a partially extended position.

FIG. 3 illustrates the drawer slide of FIG. 2 in a partially extended position, although it should be recognized that the drawer slide of FIG. 1A, or other drawer slides discussed herein, may also be so similarly extended. As may be seen in FIG. 3, the inner slide member of 215 is partially extended from the intermediate slide member 213. In turn, the intermediate slide member 213 is partially extended from the outer slide member 211. If the outer slide member is fixably mounted to a structure, with the inner slide member attached to a casing, extension of the intermediate slide member and inner slide member generally extends the casing from the structure, allowing for easier access to the casing. Alternatively, the roles of the inner slide member and outer slide member may be reversed, with the inner slide member fixedly mounted to the structure and the outer slide member attached to the casing.

Figure 4:
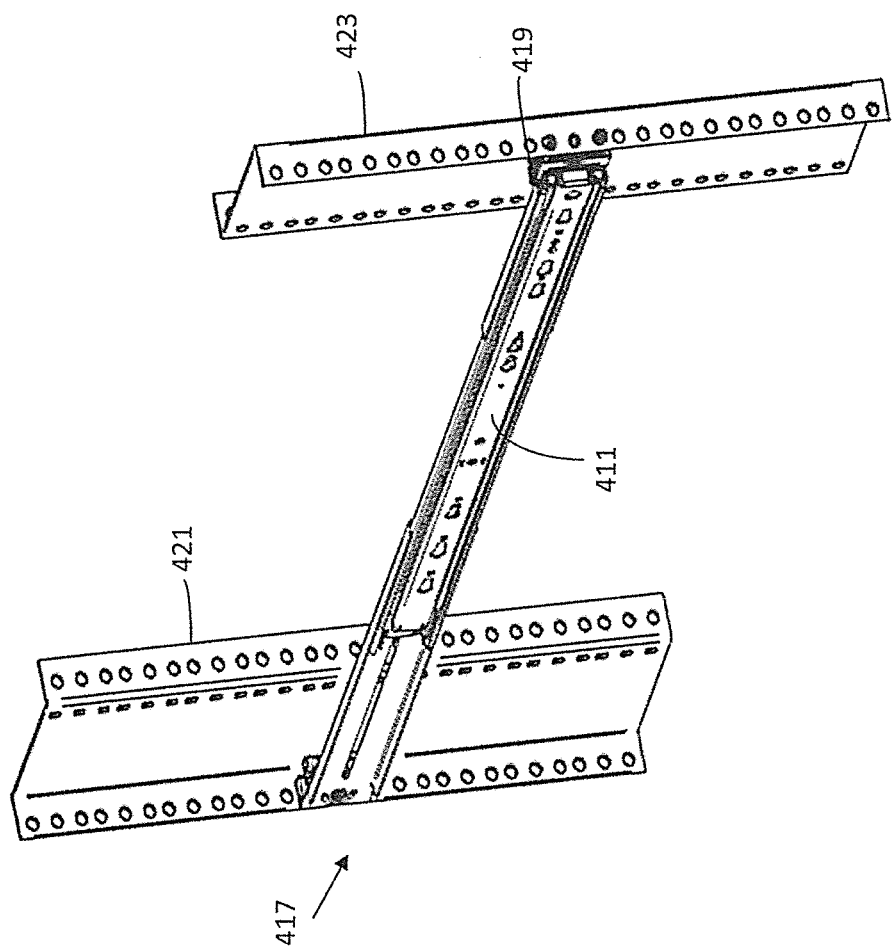
FIG. 4 illustrates an example of use of a drawer slide in a rack application.

In use, the drawer slide of FIG. 1A or 2 may be mounted to a rack, for example as shown in FIG. 4. The rack will generally include four posts, of which two posts 421, 423 are shown in FIG. 4. The posts are generally arranged to form an outline of an enclosure of rectangular cross-section. As shown in FIG. 4, a drawer slide 411 is mounted between the racks, generally using mounting hardware 417, 419. An opposing drawer slide (not shown), mounted to opposing rack posts (also not shown), is generally also used, with for example computer equipment mounted to the opposing drawer slides. Extension of the drawer slide members extends the computer equipment from the rack.

Figure 5:
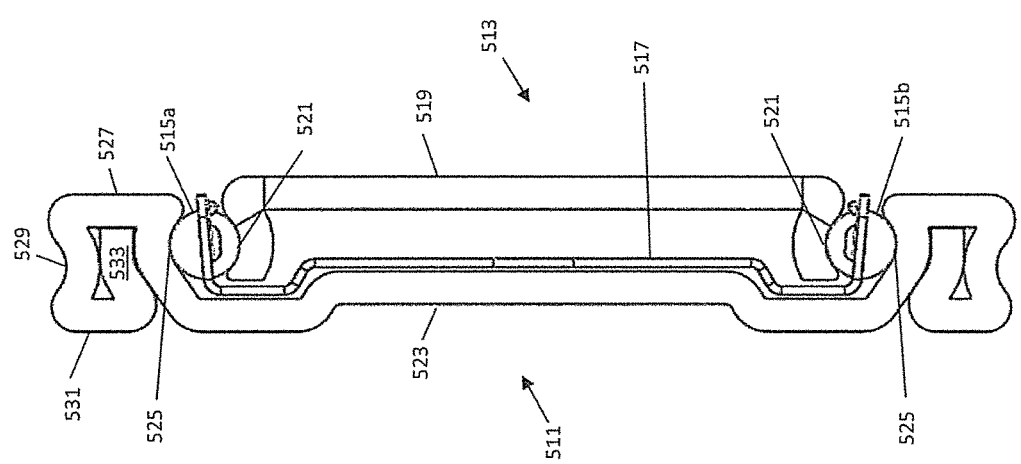
FIG. 5 illustrates a cross-section of a two member drawer slide in accordance with aspects of the invention.

FIG. 5 illustrates a further drawer slide in accordance with aspects of the invention. The drawer slide of FIG. 5 is a two member telescopic drawer slide with an outer slide member 511 and an inner slide member 513. The inner slide member is generally nestled within, and telescopically extendable from the outer drawer slide member. The inner slide member has a longitudinal web 519 bounded by outwardly facing arcuate raceways 521. The outer slide member includes a longitudinal web 523 longitudinally bounded by inwardly facing arcuate raceways 525, generally formed in a double hem. Again, and largely throughout without further mention, referring to only one of the raceway related structures, the double hem includes the inwardly facing arcuate raceways 525, a first offset 527 effectively forming a bend accounting for the width of the material of the outer slide member, an outer edge 529, a second offset 531 also effectively forming a bend arcuating for the width of the material of the outer slide member, and an interior portion 533 of the hem. Bearings 515a, 515b, couple the outer slide member and the inner slide member. The bearings, as illustrated in FIG. 5, are conveniently maintained in position with respect to one another by use of a bearing retainer 517.

Figure 6:
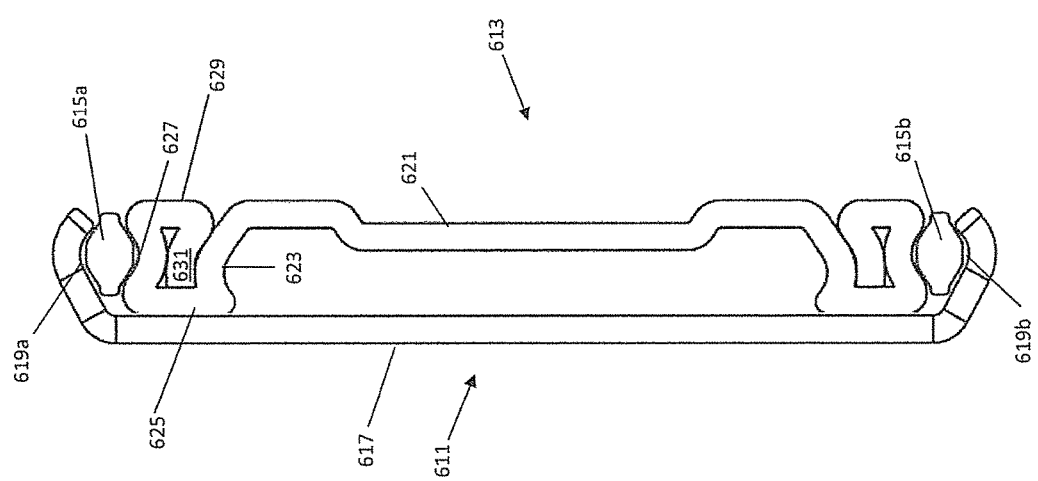
FIG. 6 illustrates a cross-section of a further two member drawer slide in accordance with aspects of the invention.

FIG. 6 illustrates a further drawer slide in accordance with aspects of the invention. In FIG. 6, an outer slide member 611 includes a longitudinal web 617 generally longitudinally bounded by arcuate raceways 619a,b containing bearings held in bearing retainers 615a,b, as illustrated in the embodiment of FIG. 6. An inner slide member 613 includes a longitudinal web 621 longitudinally bounded by outwardly facing raceways 627 formed on a top of a pedestal extending from the longitudinal edges of the web. The pedestal in the case of the slide of FIG. 6 includes a base 623 extending from longitudinal edges of the web, a first sidewall 625 extending outward from an edge of the base distal from the web, a concavely formed top providing the raceway 627, a second side wall 629 extending inwardly from a side of the top opposite the first sidewall, and a support 631 extending from the second sidewall and having a first surface in contact with and generally conforming in shape to the base and a second abutment at least partially supporting the top.

Figure 7:
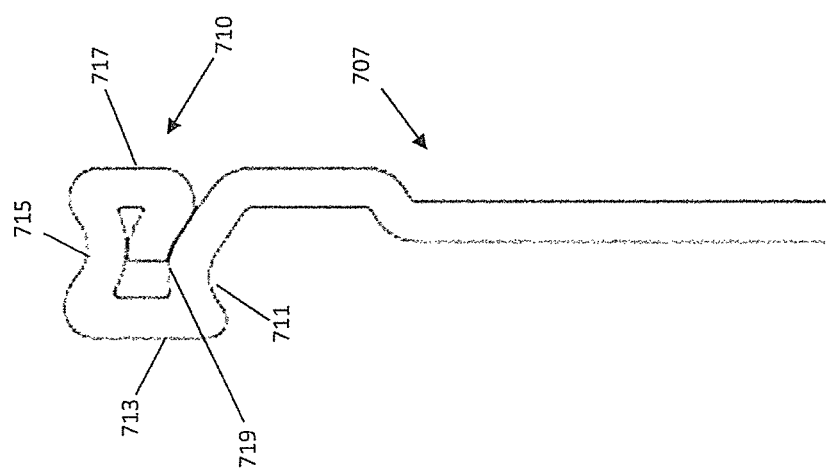
FIG. 7 illustrates a partial cross-section of a drawer slide member in accordance with aspects of the invention.

FIG. 7 illustrates a partial cross-section of a slide member in accordance with aspects of the invention. The slide member of FIG. 7 may be used, for example, as the intermediate slide member of FIG. 1A or 2, the outer slide member of FIG. 5, or the inner slide member of FIG. 6.

The slide member of FIG. 7 includes a longitudinal web 707 bounded by a raceway structures 710, one of which is shown in FIG. 7. The raceway structure includes an inwardly facing arcuate raceway 711 extending from a longitudinal edge of the longitudinal web. A first abutment 713 extends outwardly from an end of the inwardly facing raceway distal from the longitudinal web. An outwardly facing arcuate raceway 715 extends from a top of the first abutment, with the outwardly facing raceway extending back towards a plane generally defined by the longitudinal web. The outwardly facing raceway extends to a second abutment 717. The second abutment extends between an edge of the outwardly facing raceway to a partial base 719. The partial base extends partway along an outer surface of the inwardly facing arcuate raceway 711. As shown in FIG. 7, the partial base generally approaches, but does not reach, a center line of the inwardly facing arcuate raceway 711, while reaching, and supporting, a center line of the outwardly facing arcuate raceway 715.

Figure 8:
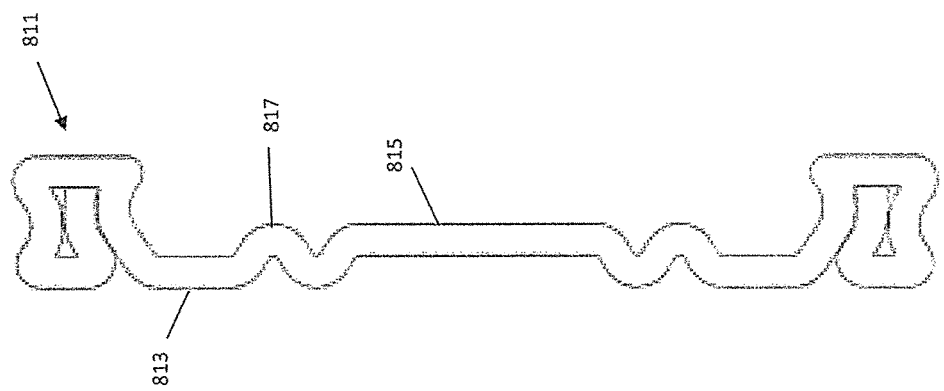
FIG. 8 illustrates a cross-section of a still further drawer slide member in accordance with aspects of the invention.

FIG. 8 illustrates a further drawer slide member in accordance with aspects of the invention. The slide member of FIG. 8 includes a generally longitudinal web bounded by raceway structures 811. As illustrated, the raceway structures have a configuration the same as the raceway structures of the intermediate slide member of FIG. 2, although in various embodiments the raceway structures may have a configuration the same as raceways structures discussed with respect to the other figures.

The longitudinal web includes longitudinal edge portions, for example edge portion 813, bounding a central longitudinal platform 815. A pair of opposing angled transitions, for example opposing angled transitions 817, separate the edge portions from the platform 815. The opposing angled transitions, which together may be of serpentine shape in cross-section, are believed to provide for increased strength of the longitudinal web.

Figure 9:
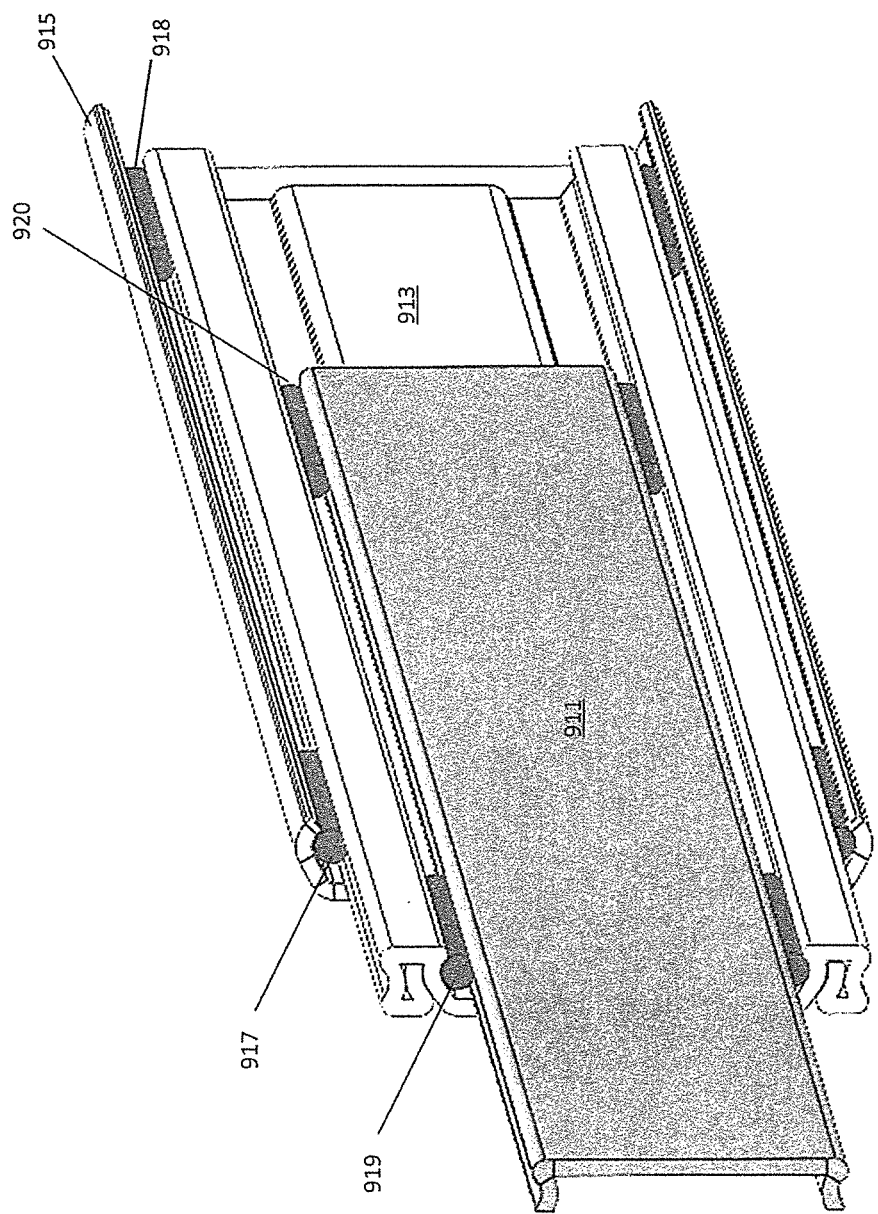
FIG. 9 illustrates portions of a friction drawer slide in accordance with aspects of the invention in a partially extended position.

FIG. 9 illustrates a friction drawer slide in accordance with aspects of the invention. The friction drawer slide, shown in an extended position, is a three member telescopic drawer slide. The drawer slide includes an inner slide member 911 generally nestled within and telescopically extendable from an intermediate slide member 913, which in turn is generally nestled within and telescopically extendable from an outer slide member 915. The inner, intermediate, and outer slide members are as discussed with respect to FIG. 2. In other embodiments, however, the intermediate slide member may be as discussed with respect to any of FIG. 1A, 1B, 7, or 8.

Coupling the slide members, however, are friction rods. Rods, for example rod 917, are fixed in the raceways of the outer slide member about a front of the outer slide member, with the rod 917 supporting the intermediate slide member during travel, for example extension or retraction of the intermediate slide member. Rods, for example rod 918, fixed in the outward facing raceways of the intermediate slide member about a rear of the intermediate slide member also supports the intermediate slide member during travel.

Similarly, rods, for example rod 919, are fixed in the inward facing raceways of the intermediate slide member about a front of the intermediate slide member, with the rod 919 supporting the inner slide member during travel. Rods, for example rod 920, fixed in the raceways of the inner slide member about its rear also supports the inner slide member during travel.

In some embodiments the rods may not be fixed in position with respect to the slide members. For example, in some embodiments the rods may float with the slide members during travel of the slide members, with recycling stops used to reposition the rods appropriately when the slides reach a fully extended position or a closed position. In such embodiments, generally rods with longer lengths are used, as compared to lengths of rods having fixed positions.

Figure 10:
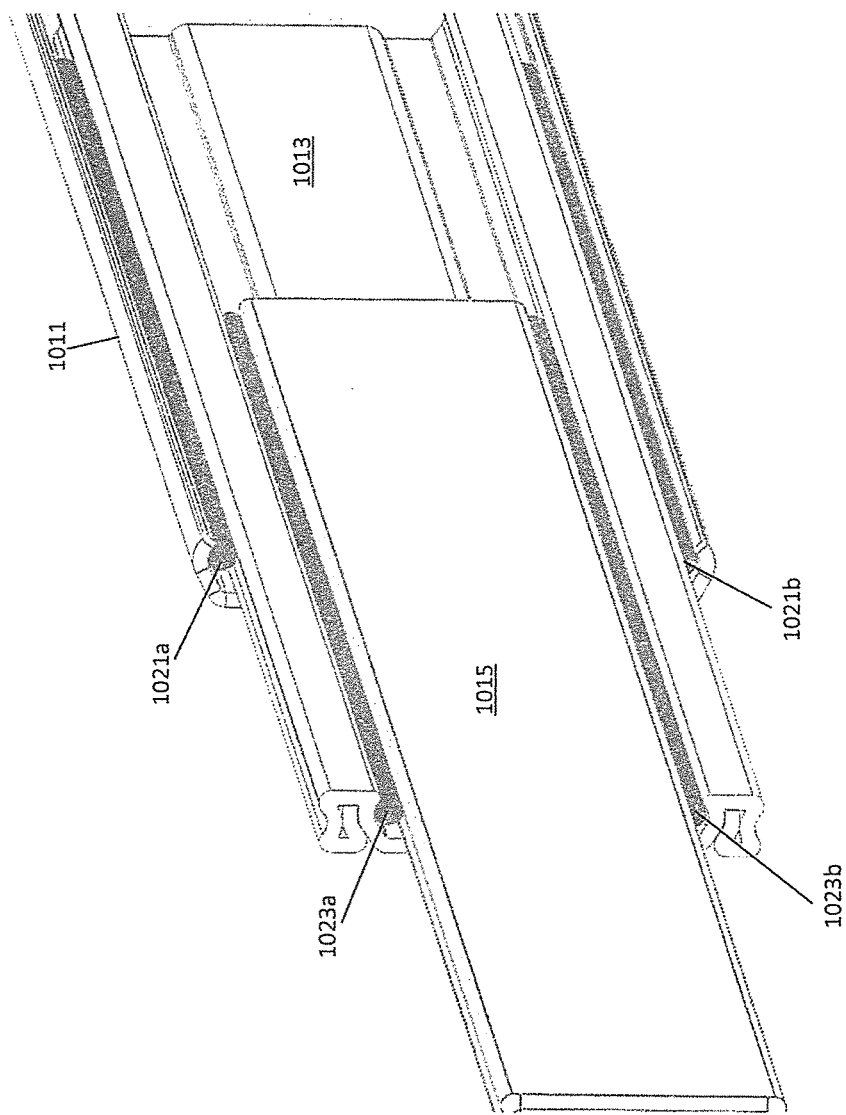
FIG. 10 illustrates portions of a friction drawer slide in accordance with aspects of the invention in a partially extended position.

FIG. 10 illustrates an embodiment of a drawer slide with floating rods. A first pair of rods 1021a,b couple an outer slide member 1011 and an intermediate slide member 1013. A second pair of rods 1023a,b couple the intermediate slide member and an inner slide member 1015. Stops (not shown) at fronts and rears of raceways of the slide members serve to prevent the rods, which are not fixed in position, from exiting the raceways. In addition, the stops provide a recycling feature, in that the stops stop forward or rearward movement of the rods at particular positions, for example fully forward or rearward in the raceways with respect to particular slides, when the slide is in a fully extended or fully retracted position.

Figure 11:
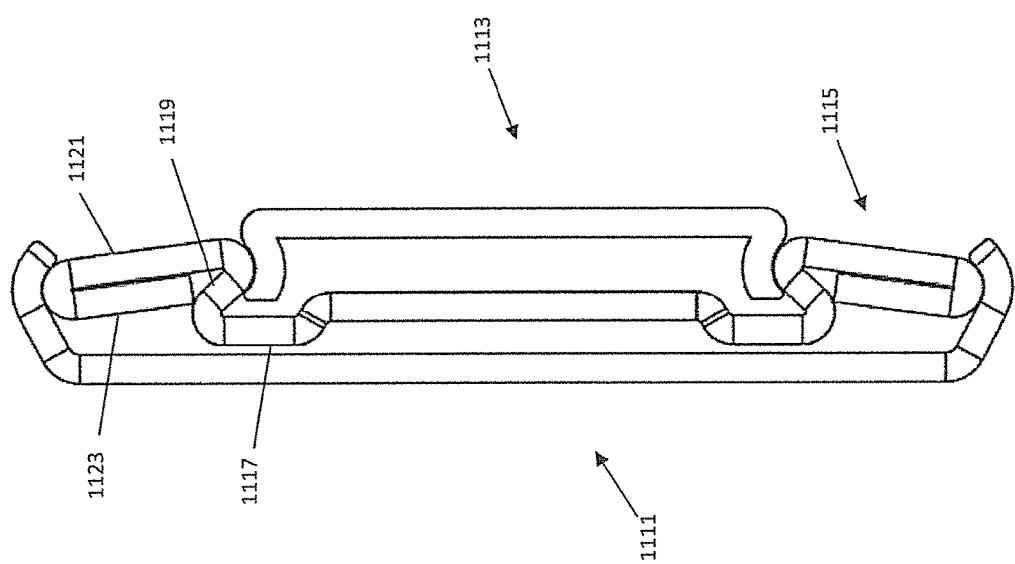
FIG. 11 illustrates a cross-section of a further friction drawer slide in accordance with aspects of the invention.

FIG. 11 illustrates a cross-section of a friction drawer slide in accordance with aspects of the invention. The friction drawer slide is a three member telescopic drawer slide, and includes an outer slide member 1111 and an inner slide member 1113 as described with regard to the slide of FIG. 1A. An intermediate slide member 1115 extendably couples the outer slide member and the inner slide member. In some embodiments the intermediate slide member is dimensioned so as to be replaceable with the intermediate slide member and bearings of the slide of FIG. 1A.

In the slide of FIG. 11, the intermediate slide member includes a generally longitudinal web 1117, which as illustrated includes a central offset platform bounded by longitudinal edges. Referring to what is seen in FIG. 11 as a top half of the slide, the intermediate slide member includes an inward angled bend 1119 forming an inward frictional contact surface for riding in an outwardly facing arcuate raceway of the inner slide member. The intermediate slide member also includes an outward frictional contact surface for riding in an inwardly facing arcuate raceway of the out slide member. The outward frictional contact surface is formed in a hemmed edge 1121, 1123 of the intermediate slide member, with the hemmed edge extending outward from the inward frictional contact surface provided by the angled bend. In the embodiment of FIG. 11, the outward extension of the hemmed edge is also slightly angled towards a plane generally defined by the longitudinal web of the intermediate slide member, to account for a slight lateral offset between raceway centers of the outwardly facing raceway of the inner slide member and the inwardly facing raceway of the outer slide member. A potential benefit of the friction slide shown in FIG. 11, is that the intermediate slide member may be formed with a sheet strip using a roll form process.

Figure 12:
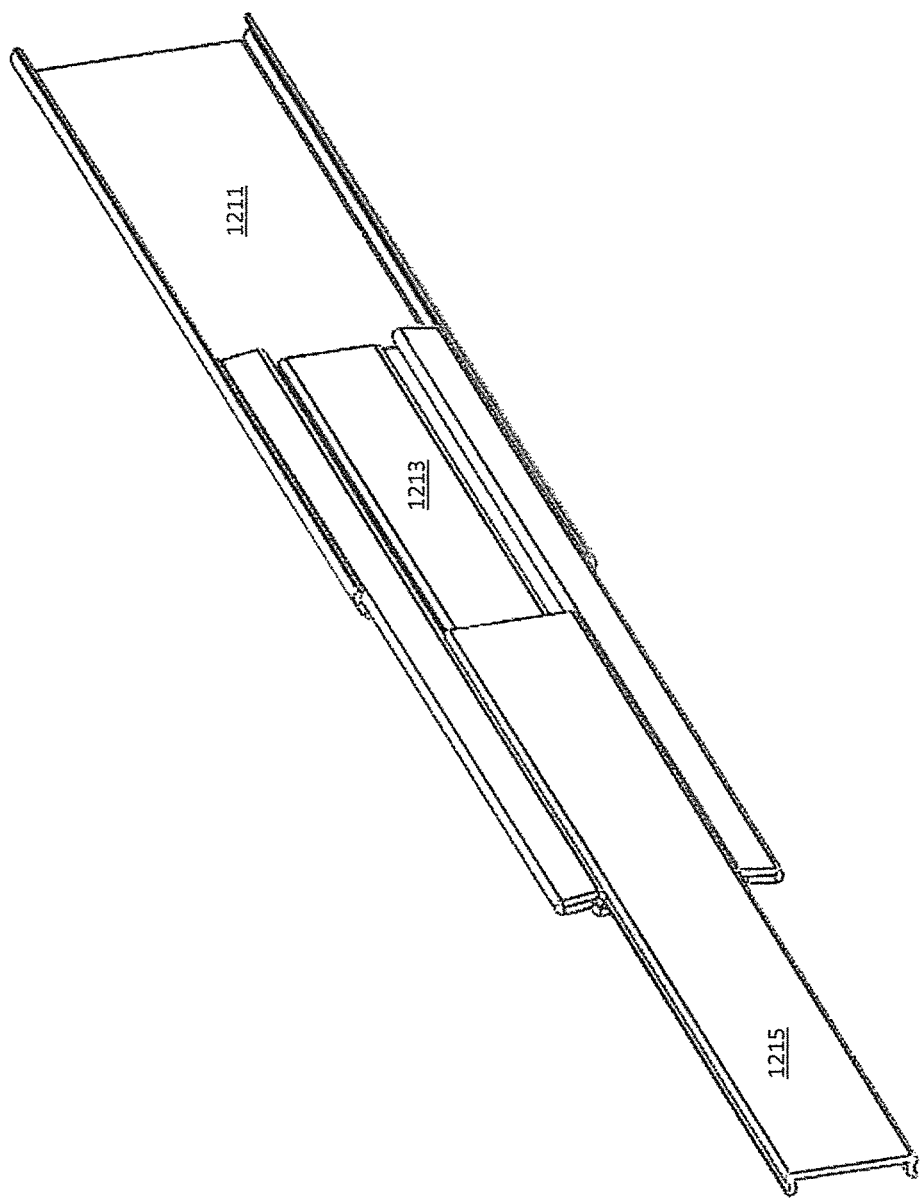
FIG. 12 illustrates the drawer slide of FIG. 12 in a partially extended position.

FIG. 12 illustrates the friction drawer slide of FIG. 11 in a partially extended position. As may be seen in FIG. 12, an inner slide member 1215 is partially extended from an intermediate slide member 1213, which in turn is partially extended from an outer slide member 1211.

Figure 13:
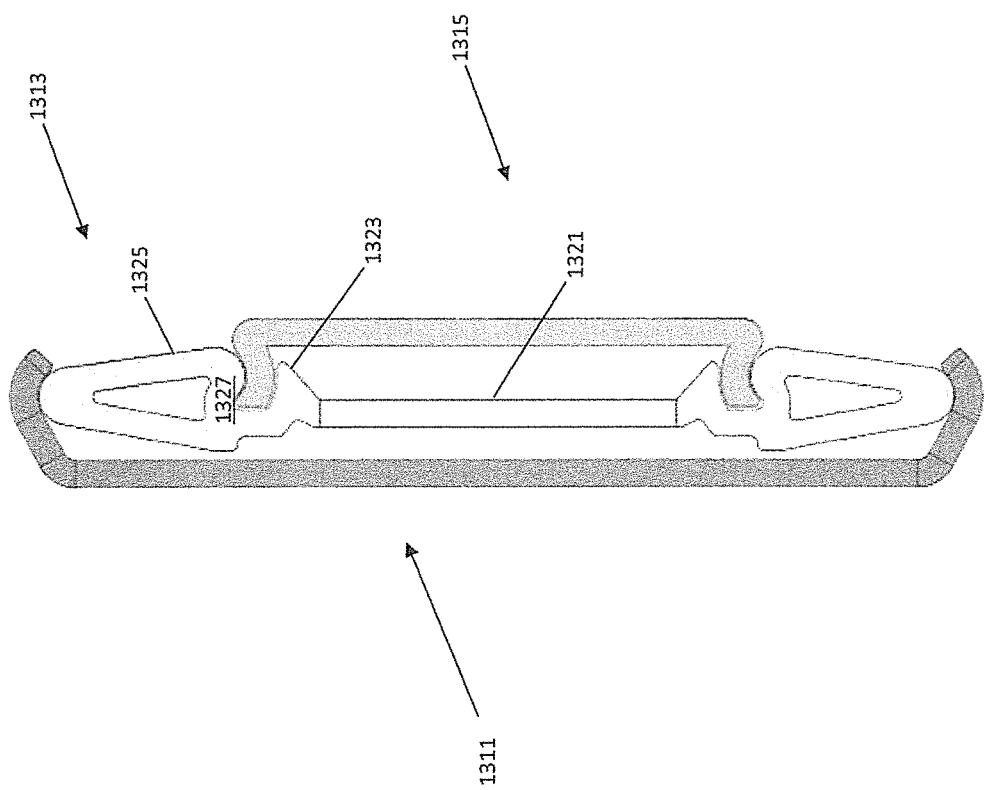
FIG. 13 illustrates a cross-section of a still further friction drawer slide in accordance with aspects of the invention.

FIG. 13 illustrates a cross-section of a further friction drawer slide in accordance with aspects of the invention. The friction drawer slide of FIG. 13 is similar to the friction drawer slide of FIG. 11, but with an intermediate slide member of a different form. Thus, the friction drawer slide of FIG. 13, like the slide of FIG. 11, is a three member telescopic drawer slide, and includes an outer slide member 1311 and an inner slide member 1315 as described with regard to the slide of FIG. 1A. An intermediate slide member 1313 extendably couples the outer slide member and the inner slide member, and in some embodiments is dimensioned so as to be replaceable with the intermediate slide member and bearings of the slide of FIG. 1A.

The intermediate slide member of FIG. 13 includes a longitudinal web generally longitudinally bounded by generally triangular lobes, for example triangular lobe 1325. An interior of the triangular lobe may be hollow, as illustrated in FIG. 13. An apex of the triangular lobe provides an outward frictional contact to ride in an inwardly facing arcuate raceway of the outer slide member. The intermediate slide of FIG. 13 may be formed, for example, by way of extrusion, with possibly post extrusion sizing performed, and possibly hard anodizing of contact surfaces.

A wall including a protruding sloping ledge 1323 couples the web and the triangular lobe. The wall connects to a base 1327 of the triangular lobe, with the connection somewhat offset from a center of the base. The connection is offset in a first direction, with the ledge generally extending from the wall in a direction opposite the first direction. A surface of the ledge, a portion of the wall, and a bottom of the base together define a notch. The notch has a shape matching a flange of the inner slide member providing an outwardly facing raceway. The notch receives the outwardly facing raceway, with a base corner of the triangular lobe providing an inward frictional contact for riding in the raceway. As the notch has a slightly curvilinear shape to match that of the outward facing raceway, and as the intermediate slide member includes notches for both outward facing raceways of the inner slide member, the notches serve to further maintain relative position of the inward frictional contact of the intermediate slide member and the raceways of the inner slide member. For example, the notches generally entraps the outwardly facing raceway of the inner member 1315, restricting and preventing a separation of the members by twist or tension.

Figure 14:
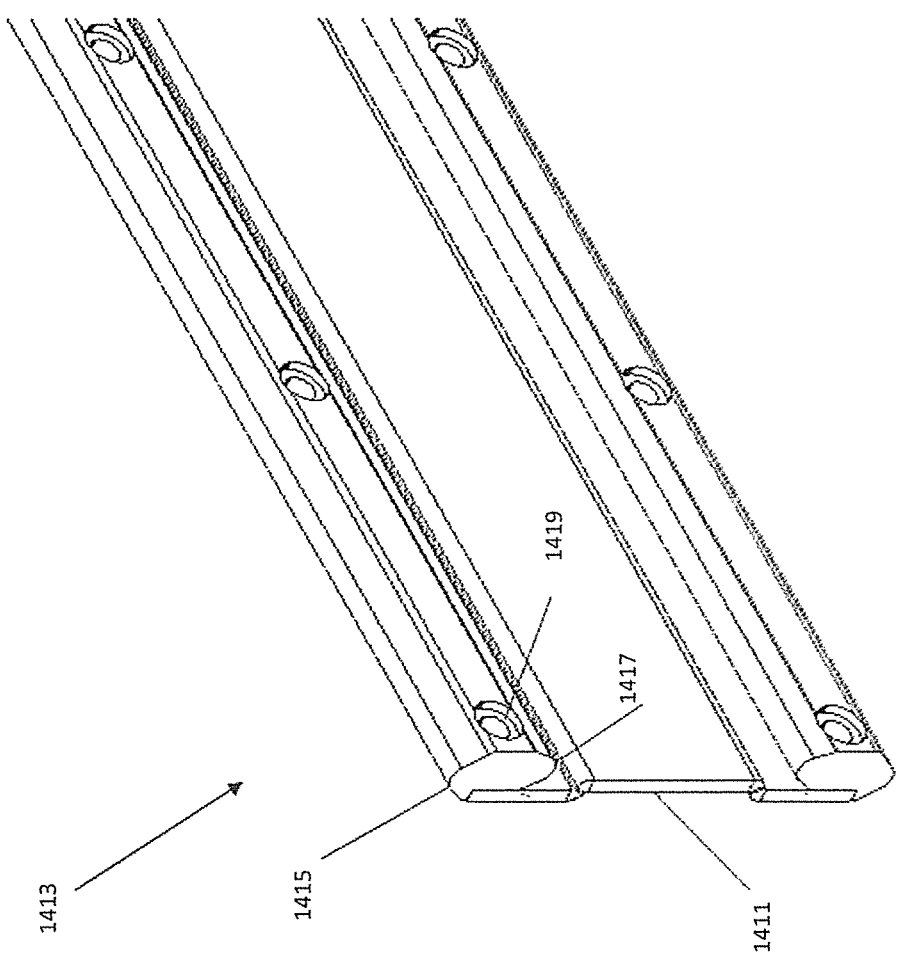
FIG. 14 illustrates an intermediate slide member of a yet still further friction drawer slide in accordance with aspects of the invention.

FIG. 14 illustrates a further intermediate slide member in accordance with aspects of the invention. The intermediate slide member of FIG. 14 is generally for use in a friction drawer slide, for example the friction drawer slide of FIG. 12. As with the intermediate slide members of FIGS. 11 and 13, the intermediate slide member of FIG. 14 is in some embodiments dimensioned so as to be replaceable with the intermediate slide member and bearings of the slide of FIG. 1A.

The slide member of FIG. 14 includes a longitudinal web 1411 longitudinally bounded by generally oval opposing lobes, one of which for example is lobe 1413. The lobes may be formed by extrusion or by injection molding, in some embodiments. The lobe 1413 includes an outward facing surface 1415, providing an outward frictional contact surface for riding in an inwardly facing raceway of an outer slide member, and an inward facing surface 1417, providing an inward frictional contact surface for riding in an outwardly facing raceway of an inner slide member.

In some embodiments the web and the opposing lobes are unitarily formed, for example of extruded aluminum. In some embodiments the frictional contact surfaces are coated, for example with Teflon, to decrease frictional forces or to decrease wear on the contact surfaces over time. In some embodiments, for example as illustrated in FIG. 14, the web and lobes are separately formed, with the lobes attached to the web by way of fasteners 1419, which for example may be rivets or the like. In such an embodiment the web may be formed of steel, for example, with the lobes formed of a rubber or plastic, for example.

Figure 15:
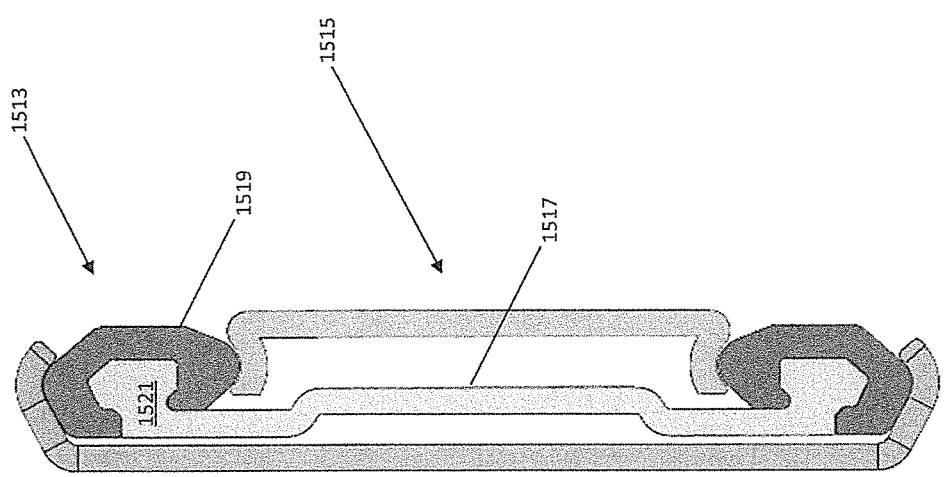
FIG. 15 illustrates a cross-section of a drawer slide with a further intermediate slide member in accordance with aspects of the invention.

FIG. 15 is a cross-sectional view of a three member telescopic drawer slide including an intermediate slide member similar to that of FIG. 14. The slide includes an outer slide member 1511, an intermediate slide member 1513, and an inner slide member 1515. The outer slide member and the inner slide member are as described with respect to, for example, FIG. 1.

As can be seen in FIG. 15, the intermediate slide member has an integrally formed web 1517 and bounding opposing heads 1521. C-shaped covers 1519 are seated over the heads, with the C-shaped covers providing frictional contact surfaces for riding in the raceways of the outer slide member and the inner slide member. Together the C-shaped covers and heads provide a structure similar to the oval lobes discussed with respect to FIG. 14. The presence of the heads provide for increased strength for the lobes, as well as providing for increased depth of material, as compared to merely the longitudinal web, for receiving fasteners or the like coupling the covers and the heads.

Although the invention has been discussed with respect to various embodiments, it should be recognized that the invention comprises the novel and non-obvious claims supported by this disclosure.

What is claimed is:

1. A friction drawer slide, comprising:
an outer slide member having a longitudinal web bounded by inwardly facing arcuate raceways;
an inner slide member having a longitudinal web bounded by outwardly facing arcuate raceways; and
an intermediate slide member, the intermediate slide member extendably coupled to the inwardly facing arcuate raceways of the outer slide member, the intermediate slide member extendably coupled to the outwardly facing arcuate raceways of the inner slide member, the intermediate slide member having a longitudinal web bounded by inward facing arcuate raceways, with abutments extending outwardly from about edges of material forming the inward facing arcuate raceways, and outward facing arcuate raceways between the abutments, and an extra layer of material abutting an outer surface of the inward facing raceways;
wherein the intermediate slide member is extendably coupled to the outer slide member by at least one friction rod in the inwardly facing arcuate raceways of the outer slide member and outward facing arcuate raceways of the intermediate slide member, and the intermediate slide member is coupled to the inner slide member by at least one further friction rod in the outwardly facing arcuate raceways of the inner slide member and inward facing arcuate raceways of the intermediate slide member.

2. The friction drawer slide of claim 1, wherein the at least one friction rod and the at least one further friction rod each comprise a plurality of friction rods.

3. The friction drawer slide of claim 2, wherein at least some of the friction rods are fixed in position with respect to the intermediate slide member.

4. The friction drawer slide of claim 2, wherein at least some of the friction rods are not fixed in position with respect to the intermediate slide member.

5. A friction drawer slide, comprising:
an outer slide member having a longitudinal web bounded by inwardly facing arcuate raceways;
an inner slide member having a longitudinal web bounded by outwardly facing arcuate raceways; and
an intermediate slide member having:
a longitudinal web longitudinally bounded by inward angled bends forming inward frictional contact surfaces for riding in the outwardly facing arcuate raceways of the inner slide member, and outward frictional contact surfaces for riding in the inwardly facing arcuate raceways of the outer slide member, wherein the outward frictional contact surfaces are each formed in a hemmed edge.

6. The friction drawer slide of claim 5, wherein the hemmed edges extend outward from the inward frictional contact surfaces provided by the inward angled bends.

7. The friction drawer slide of claim 5, wherein the longitudinal web of the intermediate slide member includes a central offset platform bounded by longitudinal edges.

8. A friction drawer slide, comprising:
an outer slide member having a longitudinal web bounded by inwardly facing arcuate raceways;
an inner slide member having a longitudinal web bounded by outwardly facing arcuate raceways;
an intermediate slide member extendably coupling the outer slide member and the inner slide member, the intermediate slide member including a longitudinal web bounded by triangular lobes, with an apex of each of the triangular lobes providing an outward frictional contact to ride in the inwardly facing arcuate raceways of the outer slide member and a base of each of the triangular lobes providing an inward frictional contact to ride in the outwardly facing arcuate raceways of the inner slide member; and
a protruding ledge proximate the base of each triangular lobe, each corresponding protruding ledge and base providing a notch to receive a corresponding flange of the inner slide member providing the outwardly facing arcuate raceways.

9. An intermediate drawer slide member for use in a friction drawer slide, the intermediate slide member comprising:
a longitudinal web,
opposing lobes longitudinally bounding the longitudinal web, the opposing lobes having a generally oval cross-section;
wherein the opposing lobes are attached to the longitudinal web by way of fasteners.

10. The intermediate drawer slide of claim 9, further comprising covers seated over the opposing lobes.

* * * * *